US009078336B2

(12) United States Patent
Setsuhara et al.

(10) Patent No.: US 9,078,336 B2
(45) Date of Patent: Jul. 7, 2015

(54) RADIO-FREQUENCY ANTENNA UNIT AND PLASMA PROCESSING APPARATUS

(75) Inventors: Yuichi Setsuhara, Suita (JP); Akinori Ebe, Kyoto (JP)

(73) Assignee: EMD CORPORATION, Yasu-shi (JP)

( * ) Notice: Subject to any disclaimer, the term of this patent is extended or adjusted under 35 U.S.C. 154(b) by 1099 days.

(21) Appl. No.: 12/921,063

(22) PCT Filed: Mar. 3, 2009

(86) PCT No.: PCT/JP2009/000956
§ 371 (c)(1),
(2), (4) Date: Nov. 22, 2010

(87) PCT Pub. No.: WO2009/110226
PCT Pub. Date: Sep. 11, 2009

(65) Prior Publication Data
US 2011/0080094 A1    Apr. 7, 2011

(30) Foreign Application Priority Data

Mar. 5, 2008  (JP) .................................. 2008-054532

(51) Int. Cl.
*H01Q 1/36*    (2006.01)
*H05H 1/46*    (2006.01)
*H01J 37/32*   (2006.01)

(52) U.S. Cl.
CPC ................ *H05H 1/46* (2013.01); *H01J 37/321* (2013.01); *H01J 37/3211* (2013.01)

(58) Field of Classification Search
CPC .... H01Q 3/44; B65D 65/403; B65D 2203/10; G06K 19/07749; H01L 35/00
USPC ......................... 156/345; 315/111; 343/700 R
See application file for complete search history.

(56) References Cited

U.S. PATENT DOCUMENTS 6,072,147 A     6/2000  Koshiishi et al.
6,181,069 B1 *  1/2001  Tonotani et al. ......... 315/111.51
(Continued)

FOREIGN PATENT DOCUMENTS

CN   1420713 A       5/2003
EP   1 589 793 A1   10/2005
(Continued)

OTHER PUBLICATIONS

International Search Report mailed Apr. 28, 2009 issued in International Patent Application No. PCT/JP2009/000956 (with translation).

(Continued)

*Primary Examiner* — Huedung Mancuso
(74) *Attorney, Agent, or Firm* — Oliff PLC

(57) ABSTRACT

The present invention aims at providing a radio-frequency antenna unit capable of generating a high-density discharge plasma in a vacuum chamber. The radio-frequency antenna unit according to the present invention includes: a radio-frequency antenna through which a radio-frequency electric current can flow; a protective tube made of an insulator provided around the portion of the radio-frequency antenna that is in the vacuum chamber; and a buffer area provided between the radio-frequency antenna and the protective tube. The "buffer area" refers to an area where an acceleration of electrons is suppressed, and it can be formed, for example, with a vacuum or an insulator. Such a configuration can suppress an occurrence of an electric discharge between the antenna and the protective tube, enabling the generation of a high-density discharge plasma in the vacuum chamber.

12 Claims, 5 Drawing Sheets

(56) References Cited

U.S. PATENT DOCUMENTS

| | | | |
|---|---|---|---|
| 6,376,978 B1 | 4/2002 | Leung et al. | |
| 2001/0008171 A1* | 7/2001 | Fukuda et al. | 156/345 |
| 2004/0221814 A1 | 11/2004 | Yeom et al. | |
| 2007/0054092 A1 | 3/2007 | Harada et al. | |
| 2007/0210037 A1 | 9/2007 | Ishida et al. | |
| 2008/0023146 A1 | 1/2008 | Shabalin | |

FOREIGN PATENT DOCUMENTS

| | | |
|---|---|---|
| JP | A-9-279350 | 10/1997 |
| JP | A-10-172792 | 6/1998 |
| JP | A-10-236871 | 9/1998 |
| JP | A-11-317299 | 11/1999 |
| JP | A-2001-156046 | 6/2001 |
| JP | A-2002-93597 | 3/2002 |
| JP | A-2003-297809 | 10/2003 |
| JP | A 2004-55600 | 2/2004 |
| JP | A-2004-281231 | 10/2004 |
| JP | A-2005-97685 | 4/2005 |
| JP | A-2007-70175 | 3/2007 |
| JP | A 2007-516921 | 6/2007 |
| JP | A-2007-227789 | 9/2007 |
| KR | 2006-0008280 A | 1/2006 |
| KR | A-10-2006-0008280 | 1/2006 |
| KR | A-10-2007-0029094 | 3/2007 |
| KR | A-10-2007-0088368 | 8/2007 |
| TW | A-353195 | 12/1986 |
| TW | A-200425285 | 1/1993 |
| TW | B-266361 | 1/1993 |
| TW | 557642 B | 10/2003 |
| TW | I227510 B | 2/2005 |
| WO | WO 2004/064460 A1 | 7/2004 |
| WO | WO 2008/070002 A1 | 6/2008 |

OTHER PUBLICATIONS

International Preliminary Report on Patentability issued Oct. 12, 2010 in International Patent Application No. PCT/JP2009/000956 (with translation).
Oct. 30, 2012 Japanese Office Action issued in Japanese Patent Application No. 2010-501797 (with translation).
Mar. 14, 2013 Office Action issued in Chinese Patent Application No. 200980107376.X (with translation).
Office Action issued in Japanese Patent Application No. 2010-501797 dated Jun. 25, 2013 (with translation).
Jun. 26, 2012 Chinese Office Action issued in Chinese Patent Application No. 200980107376.X (with translation).
Office Action issued in Chinese Patent Application No. 200980107376.X; mailed Sep. 29, 2013; with English-language translation.
May 20, 2014 Office Action issued in Japanese Patent Application No. 2013-155212 (with translation).
Dec. 1, 2014 Office Action issued in Taiwanese Application No. 98106961.
Jan. 19, 2015 Office Action issued in Korean Application No. 10-2010-7021847.
Dec. 16, 2014 Office Action issued in Japanese Application No. 2013-155212.
Mar. 26, 2014 Chinese Office Action issued in Chinese Application No. 200980107376.X (with translation).

* cited by examiner

RADIO-FREQUENCY ANTENNA UNIT AND PLASMA PROCESSING APPARATUS

TECHNICAL FIELD

The present invention relates to an inductively-coupled radio-frequency antenna and a substrate surface processing apparatus using the radio-frequency antenna.

BACKGROUND ART

In recent years, inner-antenna plasma processing apparatuses, in which a radio-frequency antenna (or antennas) is placed in a vacuum chamber, have been developed and put to practical use. In such a plasma processing apparatus, a radio-frequency electric current is applied to the radio-frequency antenna to form an induction electric field around the radio-frequency antenna, and thereby a discharge plasma is induced in the vacuum chamber. By using this discharge plasma, an intended thin film can be formed on the surface of an object to be processed or the surface of the object can be etched.

In an inner-antenna plasma processing apparatus, a negative direct current self-bias to the plasma arises in the radio-frequency antenna because an electrostatic field is formed between the radio-frequency antenna and the discharge plasma. The bias voltage accelerates ions in the plasma and drives the ions to the radio-frequency antenna, and consequently the radio-frequency antenna itself is sputtered. Atoms and ions of the material of the radio-frequency antenna which are sputtered in this manner become mixed in the discharge plasma, which causes the problem that such atoms and ions attach to the surface of a workpiece directly or after they have once attached to the inner wall or other portions of the vacuum chamber.

In order to prevent the radio-frequency antenna from being sputtered, conventionally, the exterior of the radio-frequency antenna is shielded with a protective tube made of an insulator, e.g. quartz. Patent Document 1 discloses an inner antenna in which the circumference of a copper pipe of 6 mm in diameter is shielded with a protective tube made of quartz of 15 mm in diameter.

With the configuration disclosed by Patent Document 1, the pressure in the space between the radio-frequency antenna and the protective tube is the same as the pressure of the process gas. Hence, electric discharges occur also in that space, causing the problem that the induction electric field radiating from the radio-frequency antenna is consumed by the electric discharge in the space, making it difficult to generate plasma in the vacuum chamber, which is the target area.

[Patent Document 1] Japanese Unexamined Patent Application Publication No. H11-317299

DISCLOSURE OF THE INVENTION

Problems to be Solved by the Invention

The problem to be solved by the present invention is to provide a radio-frequency antenna unit which suppresses the occurrence of an electric discharge between the radio-frequency antenna and the protective tube and generates a high-density discharge plasma in the vacuum chamber. Another problem to be solved by the present invention is to provide a plasma processing apparatus using the radio-frequency antenna unit.

Means for Solving the Problem

To solve the previously described problem, the present invention provides a radio-frequency antenna unit to be used in an apparatus for generating plasma in a vacuum chamber, including:

a) a radio-frequency antenna through which a radio-frequency electric current can flow;

b) a protective tube made of an insulator provided around the portion of the radio-frequency antenna that is in the vacuum chamber; and c) a buffer area provided between the radio-frequency antenna and the protective tube.

The term "buffer area" as used herein refers to an area in which the acceleration of electrons is suppressed. The buffer area can be formed, for example, with a vacuum or an insulator. The state of the insulator can be solid, liquid, or gas. The buffer area can be formed with an insulator having interstices, such as a fibrous insulator or a powdery insulator. For example, a commercially available glass wool is an insulator and has interstices of from several tens to several hundreds of micrometers (when used without being compressed) between the glass fibers. Even if the process gas enters such interstices, the existence of glass fibers can suppress the acceleration of electrons by a radio-frequency electric field and the ionization of the process gas which occurs due to the acceleration.

Suppressing the acceleration of electrons in the buffer area, as just described, can restrain a continuous electric discharge in this area. Accordingly, it is possible to prevent the waste of energy of the electromagnetic wave generated by the radio-frequency antenna. Therefore, plasma can be efficiently generated in the vacuum chamber.

In the present invention, the process gas may enter the buffer area as previously described. In order to further suppress the electric discharge, it is preferable that a gas seal is provided between the buffer area and the vacuum chamber. By using such a gas seal, the pressure of the gas in the buffer area can be controlled independently of the pressure in the vacuum chamber. If the buffer area is a vacuum, an electric discharge in the buffer area can be prevented more completely. Alternatively, the buffer area may communicate with the outside of the vacuum chamber so that the pressure in the buffer area is at atmospheric pressure. Since the atmospheric pressure is higher than the pressure of the process gas used in a general plasma processing, electrons collide with gas molecules more frequently. As a consequence, electrons are not sufficiently accelerated, which prevents a continuous electric discharge.

The protective tube may have a highly resistive coating on the surface of a base tube with a material which is more resistant to the plasma than the material of the base tube. This allows the selection of the material of the base tube in terms of other than plasma resistance characteristics, while ensuring high plasma resistance characteristics with the highly resistive coating.

For example, in generating a plasma containing halogen, as the material of the base tube, quartz can be used, which has a good workability although having a relatively poor resistance to a halogen-containing plasma. As the material of the highly resistive coating, any one of or the mixture of two or more of oxide ceramics (e.g. alumina or yttria), fluoride ceramics (e.g. magnesium fluoride or yttrium fluoride), nitride ceramics (e.g. silicon nitride or aluminum nitride), carbide ceramics (e.g. silicon carbide), and silicon can be used.

The radio-frequency antenna may have a highly electrically conductive coating on the surface of the metallic base member with a material which is more electrically conductive than the material of the metallic base member. Since a radio-frequency electric current in flowing through a conductor concentrates onto the surface of the conductor (i.e. the skin effect), a radio-frequency antenna having such a highly conductive coating has a high electrical conductivity regardless of the material of the metallic base member. Therefore, as the material of the metallic base member, a material having advantageous characteristics (e.g. corrosion resistance, workability, price, or other features) other than the electrical conductivity can be used.

Preferably, the radio-frequency antenna may have a tubular shape for allowing a refrigerant to pass through. This can prevent the temperature of the radio-frequency antenna from rising to increase the electrical resistance.

Such a tubular radio-frequency antenna may have a highly electrically conductive coating on the surface of a tube (or the metallic base member) made of a highly corrosion-resistive metal which is more corrosion-resistive to the refrigerant than copper, the highly electrically conductive coating being made of a metal which is electrically more conductive than the highly corrosion-resistive metal. Copper might react with a refrigerant such as water and become corroded, although advantageously being highly electrically conductive and relatively inexpensive. Hence, the use of the tube made of a highly corrosion-resistive metal can prevent corrosion by the reaction with a refrigerant. In addition, the highly electrically conductive coating can enhance the electrical conductivity compared to the case where a tube made only of a highly corrosion-resistive metal. Preferably, the highly corrosion-resistive metal may be made of stainless steel and the highly conductive coating may be made of either gold or platinum.

It is preferable that the radio-frequency antenna has an open-loop shape. An open-loop radio-frequency antenna corresponds to a coil of less than one turn and has an advantage in that it has a low inductance and a large current can flow through it. The possible shape of the open-loop radio-frequency antenna includes a rectangle, U-shape, half circle, partial arc, or other shapes.

The radio-frequency antenna unit may include an attachment for attaching the open-loop radio-frequency antenna to the vacuum chamber, the attachment being for holding both ends of the open-loop radio-frequency antenna. A communication hole communicating with the buffer area may be provided in the attachment. The communication hole can be used as an exhaust port for evacuating the buffer area or as a feed port of air for providing atmospheric pressure to the buffer area.

Effects of the Invention

With the radio-frequency antenna unit according to the present invention, the occurrence of an electric discharge between the radio-frequency antenna and the protective tube can be suppressed. Therefore, a highly productive plasma processing apparatus in which a high-density discharge plasma can be efficiently generated in the vacuum chamber can be provided.

EXPLANATION OF NUMERALS 10, 30, 40, 50, 60, 70 . . . Radio-Frequency Antenna Unit
10A, 30A, 50A, 60A, 70A . . . Radio-Frequency Antenna Unit (in a Narrow Sense)
11, 31 . . . Radio-Frequency Antenna
12, 32, 52, 62 . . . Protective Tube
13, 33 . . . Buffer Area
14, 34 . . . Feedthrough
15, 35 . . . Attachment
16 . . . Radio-Frequency Power Supply
20 . . . Plasma Processing Apparatus
21 . . . Vacuum Chamber
22 . . . Radio-Frequency Antenna Unit Attachment Hole
23 . . . Matching Box
37 . . . Vacuum Seal
38 . . . Evacuator
381 . . . Communication Hole
521 . . . Base Tube
522, 622 . . . Highly Resistive Coating
711 . . . Highly Corrosion-Resistive Tube
712 . . . Highly Electrically Conductive Coating

BEST MODES FOR CARRYING OUT THE INVENTION

Hereinafter, embodiments of the present invention will be described in detail with reference to the attached figures.

First Embodiment

Figure 1:
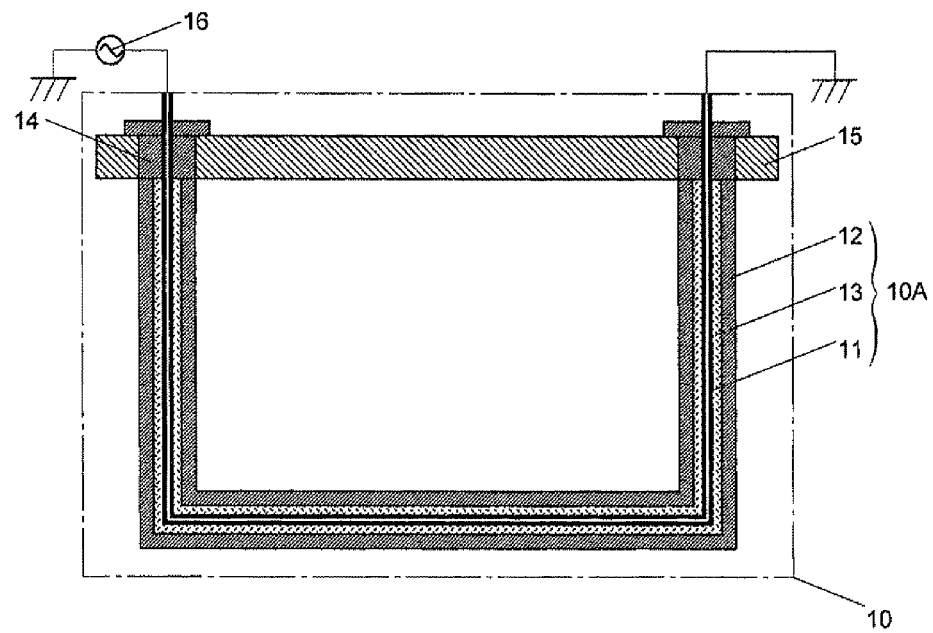
FIG. 1 is a sectional view of the first embodiment of the radio-frequency antenna unit according to the present invention.

The first embodiment of the radio-frequency antenna unit according to the present invention will be described with reference to FIG. 1. The radio-frequency antenna unit of the present embodiment has: a radio-frequency antenna 11; a protective tube 12 for covering the radio-frequency antenna 11; and a buffer area 13 provided between the radio-frequency antenna 11 and the protective tube 12. In this embodiment, the structure composed of these three components is defined as a radio-frequency antenna unit 10A in a narrow sense. The radio-frequency antenna unit 10A in a narrow sense is attached to an attachment (or vacuum flange) 15 by way of a feedthrough 14. The attachment 15 is connected to an opposite flange (not shown) provided on the wall of the vacuum chamber 21 (see FIG. 2). In the present embodiment, the set of the radio-frequency antenna unit 10A in a narrow sense, the feedthrough 14, and the attachment 15 is defined as a radio-frequency antenna unit 10 in a broad sense.

The radio-frequency antenna 11 is composed of a copper pipe. Coolant water (not shown) can flow through the inside of the pipe. The radio-frequency antenna 11 has a rectangular shape. The length of the projecting part toward the inside of the vacuum chamber is 10 cm, the length of the part parallel to the wall of the vacuum chamber is 12 cm, and the external diameter is 6 mm. One end of the radio-frequency antenna 11 is connected to the radio-frequency power supply 16 and the other end is connected to ground.

The protective tube 12 is an alumina pipe with a permittivity of approximately 9.0 and has an inner diameter of 16 mm. Therefore, the distance between the surface of the inner wall of the protective tube 12 and the surface of the outer wall of the radio-frequency antenna 11, i.e. the thickness of the buffer area 13, is 5 mm. The buffer area 13 is filled with glass wool having a substantial permittivity of 1.1 through 1.3. The average distance between the fibers of the glass wool in the filling state is several tens of μm through several hundreds of μm.

An example of the plasma processing apparatus having the radio-frequency antenna unit 10 of the first embodiment will be described with reference to FIG. 2. The plasma processing apparatus 20 has a plurality of holes (radio-frequency antenna unit attachment holes) 22 for attaching the radio-frequency antenna units 10 to the side walls of the vacuum chamber 21. The radio-frequency antenna unit 10 is attached to the vacuum chamber 21 by inserting it into the radio-frequency antenna unit attachment hole 22 from the outside of the vacuum chamber 21 and then fixing the attachment 15, with a vacuum seal sandwiched between the attachment 15 and the vacuum chamber 21. One end of the radio-frequency antenna 11 in each radio-frequency antenna unit 10 is connected to the radio-frequency power supply 16 via a matching box 23, and the other end is connected to ground. A plurality of radio-frequency antennas 11 are connected to one radio-frequency power supply 16.

Figure 2:
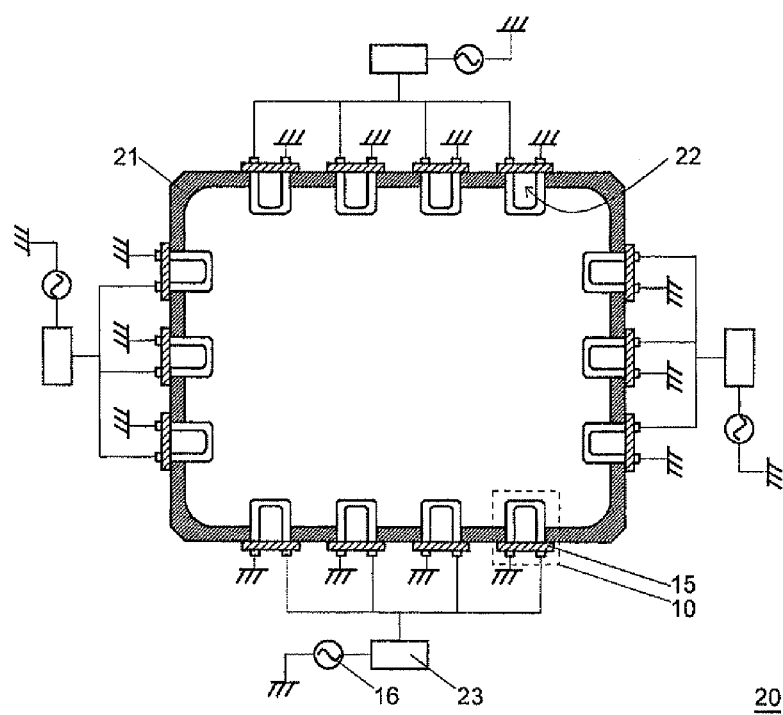
FIG. 2 is a schematic configuration diagram showing an embodiment of the plasma processing apparatus according to the present invention.

In the example of FIG. 2, radio-frequency antenna units 10 are provided on the side walls of the vacuum chamber. However, the radio-frequency antenna units 10 can be provided on the ceiling or on both the side walls and the ceiling. Also in the case where radio-frequency antenna units 30 and 40 of the second and third embodiments (which will be described later) are used, a plasma processing apparatus similar to that in the first embodiment can be configured.

The results of an experiment conducted by using the radio-frequency antenna unit 10 of the present embodiment will be described. In this experiment, the radio-frequency antenna unit 10 was mounted onto the ceiling of the vacuum chamber, and one end of the radio-frequency antenna is connected to the radio-frequency power supply 16 with a frequency of 13.56 MHz via a matching box (not shown) while the other end was connected to ground. Then, a mixture gas of argon and hydrogen was introduced into the vacuum chamber. After that, a discharge plasma was generated in the vacuum chamber while the gas pressure was changed in the range from 0.5 to 30 Pa. The results showed that an electric charge was not induced in the buffer area 13 at any value of the gas pressure, which confirmed that the injected radio-frequency electric power was efficiently consumed for the generation of an electric discharge plasma in the vacuum chamber. This is probably because the existence of fibers of the glass wool in the buffer area 13 suppressed the acceleration of electrons, preventing an ionization of the gas.

Second Embodiment

Figure 3:
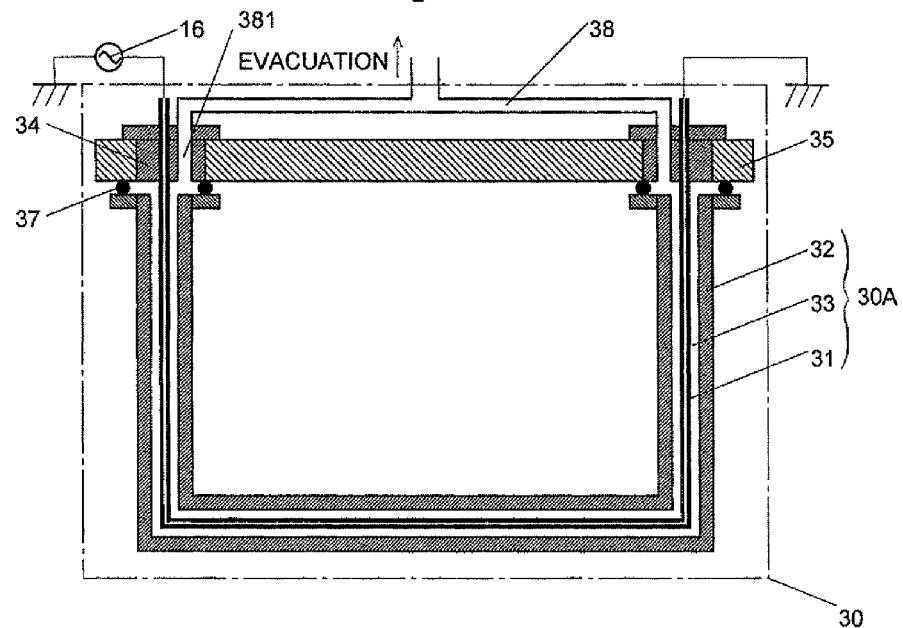
FIG. 3 is a sectional view of the second embodiment of the radio-frequency antenna unit according to the present invention.

A radio-frequency antenna unit 30 of the second embodiment according to the present invention will be described with reference to FIG. 3. The shape and dimensions of the radio-frequency antenna 31 and the protective tube 32 are the same as those in the first embodiment. Also, the area between the radio-frequency antenna 31 and the protective tube 32 is filled with glass wool as in the first embodiment. In this embodiment, the end faces of the protective tube 32 are fixed to the attachment 35, with a vacuum seal 37 sandwiched in between. The buffer area 33 communicates with a communication hole 381 provided in the attachment 35. The inside of the buffer area 33 can be evacuated with an evacuator 38 connected to the communication hole 381 to be in a high-vacuum state of not more than 0.1 Pa.

The radio-frequency antenna unit 30 (in a broad sense) of the present embodiment was attached to the ceiling of the vacuum chamber, and connected to both the radio-frequency power supply and ground as in the first embodiment. After a mixture gas of argon and hydrogen was introduced into the vacuum chamber, a discharge plasma was generated in the vacuum chamber. In this embodiment, the pressure of the buffer area 33 was maintained to be not higher than 0.05 Pa. The pressure inside the vacuum chamber was changed in a range from 0.5 to 30 Pa. The results showed that an electric discharge was not induced in the buffer area 13 at any level of the gas pressure, which confirmed that the injected radio-frequency electric power was efficiently consumed for the generation of an electric discharge plasma in the vacuum chamber.

Third Embodiment

Figure 4:
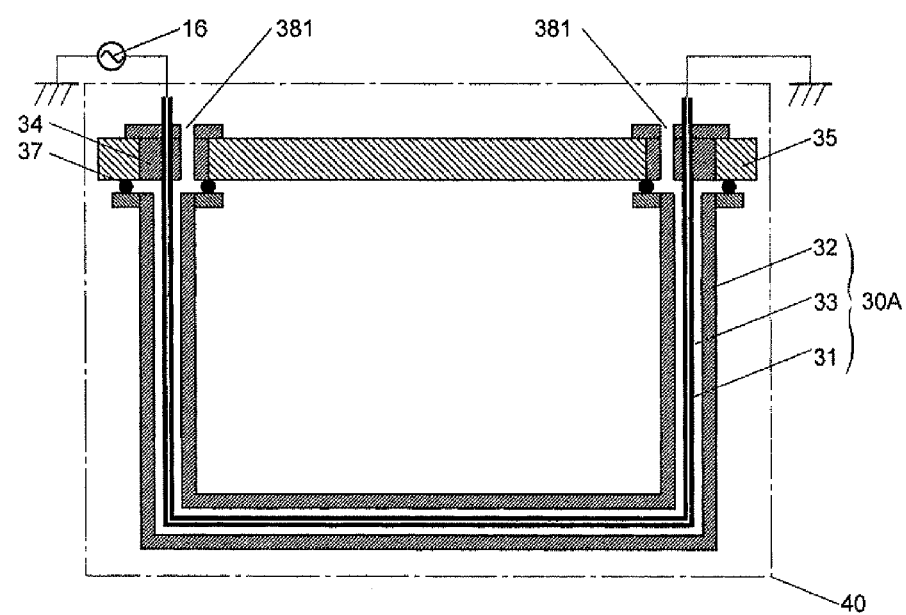
FIG. 4 is sectional view of the third embodiment of the radio-frequency antenna unit according to the present invention.

A radio-frequency antenna unit 40 of the third embodiment according to the present invention will be described with reference to FIG. 4. The radio-frequency antenna unit 40 of the present embodiment has the same configuration as that of the radio-frequency antenna unit 30 of the second embodiment, except that the communication hole 381 is open to the atmosphere.

The minimum voltage (or spark voltage) $V_s$ for an electric discharge to occur between two electrodes across a space conforms to Paschen's Law. According to Paschen's Law, in the case where the space (or buffer area 33) is evacuated so that the gas pressure is sufficiently low, the spark voltage $V_s$ increases to make an electric discharge occur less easily. Also in the case where the gas pressure, p, is sufficiently large, the spark voltage $V_s$ becomes high. This is because the higher the gas pressure p becomes, the more often electrons collide with gas molecules, so that the electrons are not sufficiently accelerated. However, the difficulty of the occurrence of an electric discharge depends not only on the gas pressure p but also on the distance between the electrodes.

In an inner-antenna plasma processing apparatus, a key factor for this problem is the discharge voltage between the radio-frequency antenna and the wall (which is generally connected to ground) of the vacuum chamber. In particular, the discharge voltage between each foot of the radio-frequency antenna and the wall, where the distance between them is smallest, is important. This minimum distance is generally between a few mm and a few cm. In such a distance range, if the buffer area is at atmospheric pressure, the condition that the gas pressure p is sufficiently high is satisfied and an occurrence of an electric discharge can be suppressed. Therefore, it is possible to suppress an occurrence of an electric discharge with a simple configuration in which the communication hole 381 is open to the atmosphere as in the third embodiment.

Fourth Embodiment

Figure 5:
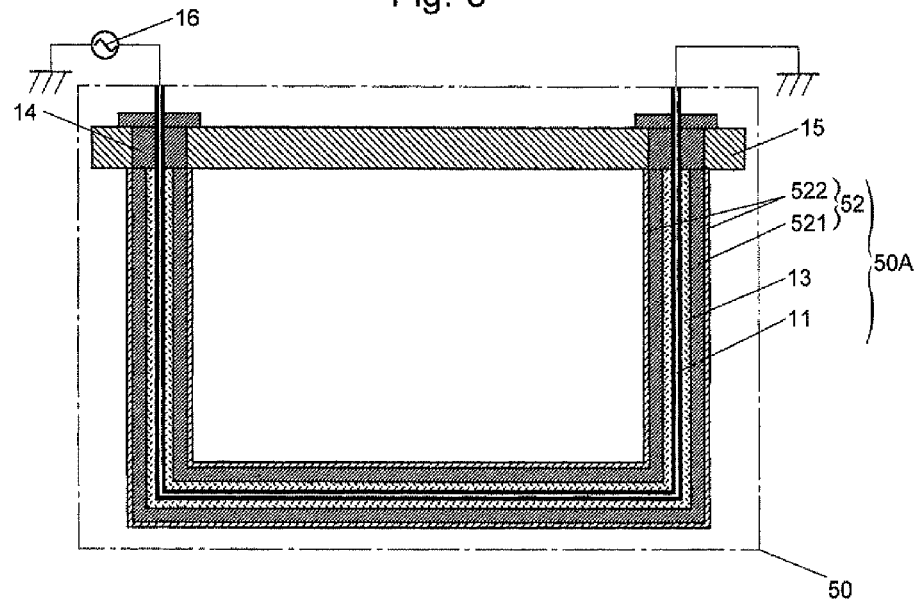
FIG. 5 is sectional view of the fourth embodiment of the radio-frequency antenna unit according to the present invention.

A radio-frequency antenna unit 50 of the fourth embodiment according to the present invention will be described with reference to FIG. 5. In the radio-frequency antenna unit 50 of the present embodiment, in place of the protective tube 12 made of alumina in the radio-frequency antenna unit 10 of the first embodiment, a protective tube 52 is used in which the surface of a base tube 521 made of quartz is coated with a highly resistive coating 522 made of alumina. The radio-frequency antenna 11, the protective tube 52, and the buffer area 13 compose a radio-frequency antenna unit 50A in a narrow sense. Other configuration of the radio-frequency antenna unit 50 is the same as that of the radio-frequency antenna unit 10 of the first embodiment.

Since quartz has better workability than alumina, the use of the base tube 521 made of quartz makes it easy to conform the shape of the base tube 521 to the U-shape of the radio-frequency antenna 11. Furthermore, since alumina is more resistant to a halogen-containing plasma than quartz, the use of the highly resistive coating 522 made of alumina prevents the protective tube 52 from being etched by the plasma.

Figure 6:
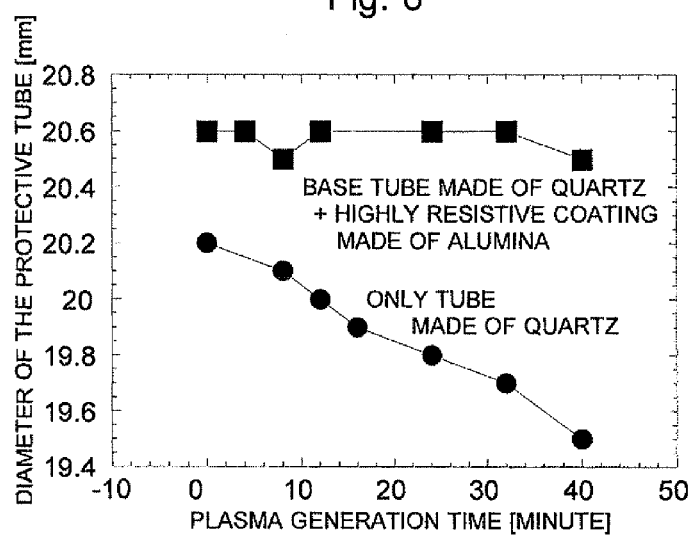
FIG. 6 is a graph showing the measurement result of the change of the diameter of the protective tube over time while a fluorine plasma was generated, for the case where the radio-frequency antenna unit of the fourth embodiment was used and for the case where a radio-frequency antenna unit in which the protective tube was composed only of a quartz tube was used.

The change of the diameter of the protective tube over time while a fluorine plasma was generated around a radio-frequency antenna unit was measured for the case where the radio-frequency antenna unit 50 of the fourth embodiment was used and for the case where a radio-frequency antenna unit in which the protective tube was composed only of a quartz tube was used. In this experiment, one radio-frequency antenna unit was provided in the vacuum chamber. $CF_4$ gas and $O_2$ gas were supplied with a flow ratio of 1:5 to a pressure of 1.0 Pa, and then a radio-frequency electric power of 1000 W was continuously injected for 40 minutes. The results showed that, as shown in FIG. 6, the diameter of the protective tube 52 did not substantially change with the radio-frequency antenna unit 50 of the fourth embodiment, while the diameter of the protective tube gradually decreased over time in the case where the radio-frequency antenna unit in which the protective tube was composed only of a quartz tube was used. This confirmed that the protective tube 52 is very resistive to a fluorine plasma.

Fifth Embodiment

Figure 7:
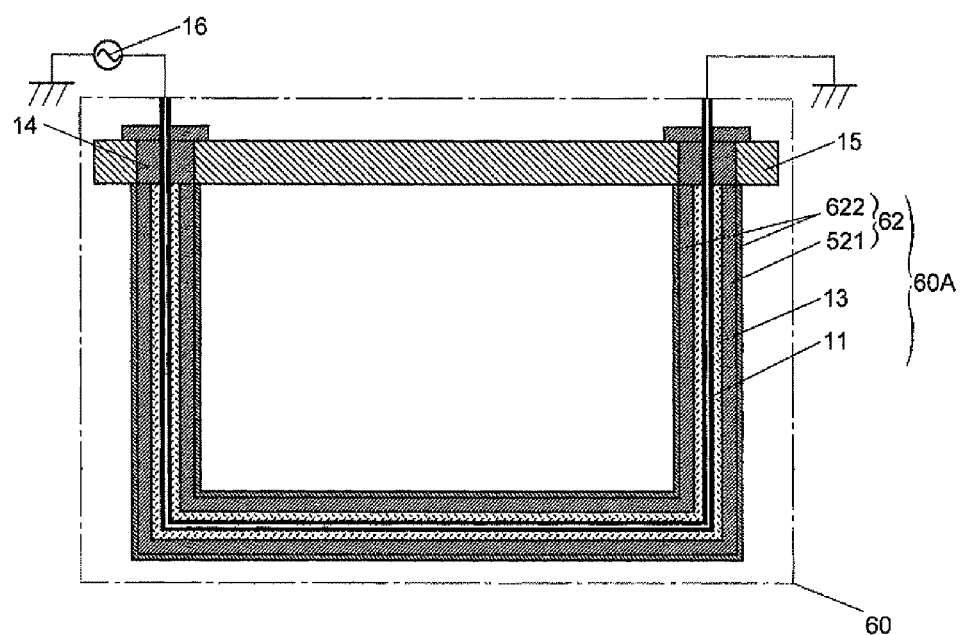
FIG. 7 is a sectional view of the fifth embodiment of the radio-frequency antenna unit according to the present invention.

A radio-frequency antenna unit 60 of the fifth embodiment according to the present invention will be described with reference to FIG. 7. In the radio-frequency antenna unit 60 of the present embodiment, in place of the protective tube with the highly resistive coating 522 made of alumina in the radio-frequency antenna unit 50 of the fourth embodiment, a protective tube 62 with a highly resistive coating 622 made of silicon is used. The other configuration of the radio-frequency antenna unit 60 is the same as that of the radio-frequency antenna unit 50 of the fourth embodiment. The radio-frequency antenna unit 60 of the present embodiment can be preferably used for preventing the material of the protective tube from being mixed into a processing object as an impurity, in performing a plasma processing with silicon, such as an etching of a silicon substrate, deposition of a silicon thin film, or other processing.

Sixth Embodiment

Figure 8:
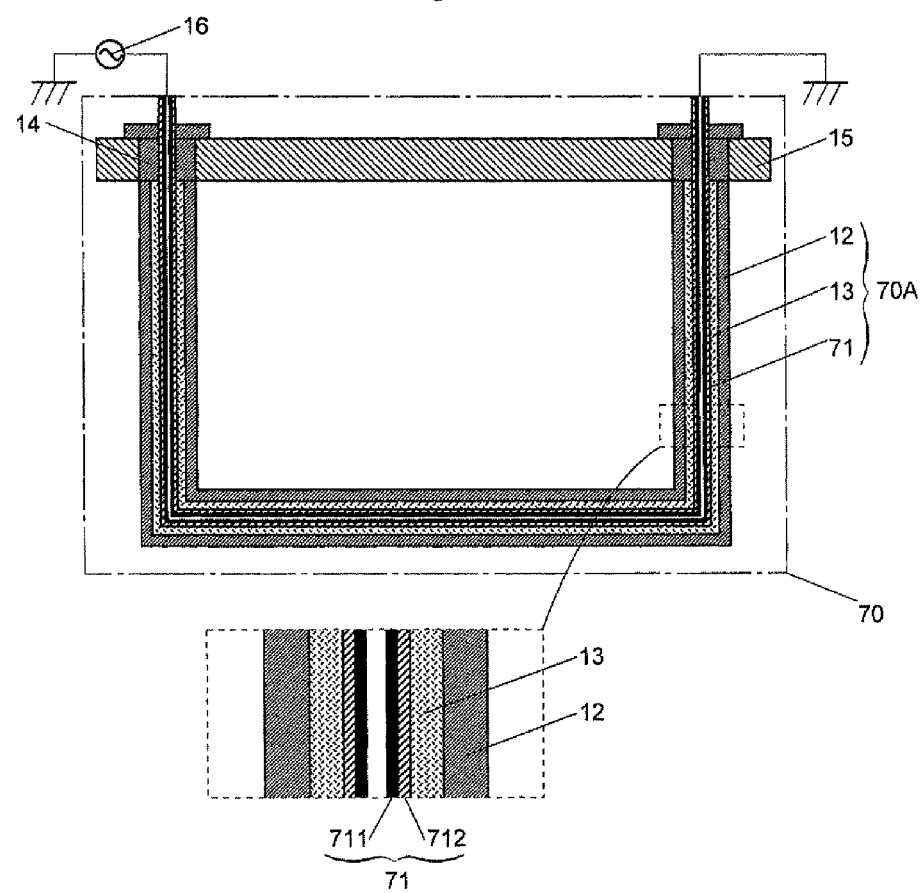
FIG. 8 is a sectional view of the sixth embodiment of the radio-frequency antenna unit according to the present invention.

A radio-frequency antenna unit 70 of the sixth embodiment according to the present invention will be described with reference to FIG. 8. In the radio-frequency antenna unit 70 of the present embodiment, in place of the radio-frequency antenna 11 composed of a copper pipe in the radio-frequency antenna unit 10 of the first embodiment, a highly corrosion-resistive tube 711 made of stainless steel which has a highly electrically conductive coating 712 made of gold on the surface thereof is used. The other configuration of the radio-frequency antenna unit 70 is the same as that of the radio-frequency antenna unit 10 of the first embodiment. Since the highly corrosion-resistive tube 711 made of stainless steel contacts coolant water, the radio-frequency antenna unit 70 of the present embodiment is less corrosive than a radio-frequency antenna using a copper tube. In addition, the use of the highly electrically conductive coating 712 made of gold ensures a high electrical conductivity.

The following experiment was performed for the radio-frequency antenna unit 70 and for a radio-frequency antenna unit having the same configuration as that of the radio-frequency antenna unit of the sixth embodiment except that a radio-frequency antenna was used in which the surface of a copper tube was coated with gold. The radial thickness of the highly corrosion-resistive tube 711 made of stainless steel and that of the tube made of copper were set to be 1 mm. The thickness of the golden coating was set to be 40 µm for both tubes. These two different radio-frequency antenna units were mounted in the vacuum chamber. After hydrogen gas was supplied into the vacuum chamber to 1.3 Pa, a radio-frequency electric power of 2000 W was continuously injected to the radio-frequency antenna for 1000 hours while supplying coolant water to the tubes. Then, the radial thickness of the highly corrosion-resistive tube 711 made of stainless steel and that of the tube made of copper were measured. While the radial thickness of the tube made of copper had decreased to 0.82 mm, that of the highly corrosion-resistive tube 711 made of stainless steel was still 1 mm.

Although glass wool was used as the insulator to fill the buffer area in the first though sixth embodiments, the insulator is not limited to glass wool. The buffer area can be filled with dielectric microspheres, dielectric particles or some other substances to obtain the same effect. The buffer area can be filled with an insulation liquid or gas, such as an insulation oil to obtain the same effect. Such insulation liquid or gas may be circulated to cool the radio-frequency antenna.

In the examples of the first though sixth embodiments, rectangular radio-frequency antennas were used. However, the radio-frequency antenna can have any shape, such as a U-shape, half circle, circle, linear shape, or other shape.

The invention claimed is:

1. A radio-frequency antenna unit to be used in an apparatus for generating plasma in a vacuum chamber, comprising:
   a) a radio-frequency antenna through which a radio-frequency electric current can flow;
   b) a protective tube made of an insulator provided around a portion of the radio-frequency antenna that is in the vacuum chamber; and
   c) a buffer area provided between the radio-frequency antenna and the protective tube,
   wherein a gas seal, in addition to the protective tube, is provided between the buffer area and an inside of the vacuum chamber.

2. The radio-frequency antenna unit according to claim 1, wherein the buffer area is a vacuum.

3. The radio-frequency antenna unit according to claim 1, wherein a pressure in the buffer area is at atmospheric pressure.

4. The radio-frequency antenna unit according to claim 1, wherein the protective tube has a highly resistive coating on a surface of a base tube with a material which is more resistant to the plasma than a material of the base tube.

5. The radio-frequency antenna unit according to claim 4, wherein the material of the base tube is quartz, and the material of the highly resistive coating is any one of or a mixture of two or more of oxide ceramics, fluoride ceramics, nitride ceramics, carbide ceramics, and silicon.

6. The radio-frequency antenna unit according to claim 1, wherein the radio-frequency antenna has a highly electrically conductive coating on a surface of a metallic base member with a material which is electrically more conductive than a material of the metallic base member.

7. The radio-frequency antenna unit according to claim 1, wherein the radio-frequency antenna has a tubular shape for allowing a refrigerant to pass through.

8. The radio-frequency antenna unit according to claim 7, wherein the radio-frequency antenna has a highly electrically conductive coating on a surface of a tube made of a highly corrosion-resistive metal which is more corrosion-resistive to the refrigerant than copper, the highly electrically conductive coating being made of a metal which is electrically more conductive than the highly corrosion-resistive metal.

9. The radio-frequency antenna unit according to claim 8, wherein the highly corrosion-resistive metal is stainless steel and the highly conductive coating is made of either gold or platinum.

10. The radio-frequency antenna unit according to claim 1, wherein the radio-frequency antenna has an open-loop shape.

11. The radio-frequency antenna unit according to claim 10, comprising an attachment for attaching the open-loop radio-frequency antenna to the vacuum chamber, the attachment being for holding both ends of the open-loop radio-frequency antenna, wherein a communication hole which communicates with the buffer area is provided in the attachment.

12. A plasma processing apparatus having at least one of the radio-frequency antenna units according to claim 1.

* * * * *